(12) United States Patent
Hirahara et al.

(10) Patent No.: US 6,885,096 B2
(45) Date of Patent: Apr. 26, 2005

(54) SEMICONDUCTOR DEVICE HAVING AT LEAST THREE POWER TERMINALS SUPERPOSED ON EACH OTHER

(75) Inventors: Fumio Hirahara, Yokohama (JP); Kenichi Ogata, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/900,946

(22) Filed: Jul. 10, 2001

(65) Prior Publication Data

US 2002/0024129 A1 Feb. 28, 2002

(30) Foreign Application Priority Data

Jul. 11, 2000 (JP) ......................................... 2000-210475

(51) Int. Cl.[7] ...................... H01L 23/48; H01L 23/495; H01L 23/34
(52) U.S. Cl. ..................... 257/692; 257/690; 257/724; 257/666; 257/734
(58) Field of Search ......................... 257/690, 691–693, 257/724, 734, 666, 776, 777; 361/783

(56) References Cited

U.S. PATENT DOCUMENTS

| | | | | |
|---|---|---|---|---|
| 4,426,689 A | * | 1/1984 | Henle et al. ................. | 361/749 |
| 4,454,529 A | * | 6/1984 | Philofsky et al. ............ | 257/665 |
| 5,408,128 A | * | 4/1995 | Furnival ...................... | 257/690 |
| 5,828,125 A | * | 10/1998 | Burns .......................... | 257/666 |
| 6,083,772 A | * | 7/2000 | Bowman et al. ............ | 438/106 |
| 6,208,521 B1 | * | 3/2001 | Nakatsuka ................... | 361/749 |

FOREIGN PATENT DOCUMENTS

| | | | |
|---|---|---|---|
| EP | 0588094 | * | 3/1994 |
| JP | 406188335 | * | 7/1994 |
| JP | 07-202072 | * | 8/1995 |
| JP | 11-17087 | * | 1/1999 |
| JP | 11-163045 | | 6/1999 |
| KR | 6-151685 | | 5/1994 |

* cited by examiner

*Primary Examiner*—Kamand Cuneo
*Assistant Examiner*—James Mitchell
(74) *Attorney, Agent, or Firm*—Oblon, Spivak, McClelland, Maier & Neustadt, P.C.

(57) ABSTRACT

The present has an object of reducing a wiring resistance caused by the wiring metal such as bonding wire, and self-inductance, in a semiconductor device for large power, such as IGBT module. Therefore, the invention has at lest three or more power terminals superimposed on each other, wherein at least one semiconductor chip is connected electrically in a way to be sandwiched between predetermined two power terminals among the power terminals. A power terminal on one end among the aforementioned superposed power terminals and a power terminal on the other end among the superposed power terminals can be led out in the same direction, for example.

19 Claims, 5 Drawing Sheets

SEMICONDUCTOR DEVICE HAVING AT LEAST THREE POWER TERMINALS SUPERPOSED ON EACH OTHER

CROSS-REFERENCE TO RELATED APPLICATIONS

This application is based upon and claims the benefit of priority from the prior Japanese Patent Application No. 2000-210475, field Jul. 11, 2000, the entire contents of which are incorporated herein by reference.

BACKGROUND OF THE INVENTION

1. Field of the Invention

The present invention relates to a semiconductor device for large power, such as IGBT module. Also, the invention is applied to the structure of semiconductor device required to reduce the power loss.

2. Description of the Related Art

A structure, as shown in FIG. 9 for instance, is known as an example of semiconductor device for large power according to the prior art. Here, this example relates to the structure of IGBT module.

In FIG. 9A, a collector side of an IGBT chip 65 and an n layer side of a diode chip 66 are soldered respectively, on a Cu pattern 63 of the surface of a DBC (Direct Bond Copper) substrate wherein copper conductors sandwich an insulation substrate 67 of alumina. An emitter side of the IGBT chip 65 and a p layer side of the diode chip 66 are connected with an external power terminal 61, through an Al bonding wire of, for example, 200 to 500 $\mu m\phi$, extending from both chips. On the other hand, the surface Cu pattern 63 is connected to an external power terminal 62. Such structure is placed on a heat radiation plate 69. In FIG. 9A, a gate terminal 70 shown in FIG. 9B is not illustrated.

On the other hand, in a conventional module structure as shown in FIG. 9A, the external power terminal 61 is connected with the chip 65, 66 through the bonding wire 64. Consequently, wiring resistance caused by the bonding wire 64 and self-inductance increase inconveniently.

Therefore, the present invention is devised considering problems of the aforementioned structure, and has an object of providing a semiconductor device for large power, such as IGBT module, reducing a wiring resistance caused by the wiring metal such as bonding wire, and self-inductance, and further improving the heat diffusion.

BRIEF SUMMARY OF THE INVENTION

The present invention relates to a structure for reducing a wiring resistance caused by the wiring metal such as bonding wire, and self-inductance, and further improving the heat diffusion, and is a semiconductor device having at least three or more power terminals superimposed on each other, at least one semiconductor chip arranged in a way sandwiched between two predetermined power terminals among the power terminals, wherein the two power terminals and the semiconductor chip are connected electrically each other.

By providing such a configuration, it becomes possible to reduce considerably the voltage drop due to the internal wiring, because the connection between semiconductor chips and power terminals is realized by a short distance and through a surface. Also, in a case of adopting an array for flowing current mutually in the opposite direction in a way to reduce the inductance component of the external power terminal, it is possible to intend to reduce further by a mutual inductance.

Further, it is possible to realize a structure unnecessary to connect additionally a new another heat radiation plate, as the power terminals of both upper and lower ends and the relay power terminal function as heat radiation plate, allowing to intend to reduce the process load and to cut the cost. In addition, it is possible to make a structure not requiring an insulation substrate for wiring layout. Therefore, a low heat resistance can be realized, as it becomes unnecessary to use an insulation substrate of lower heat conductivity than the metal.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Figure 9A:
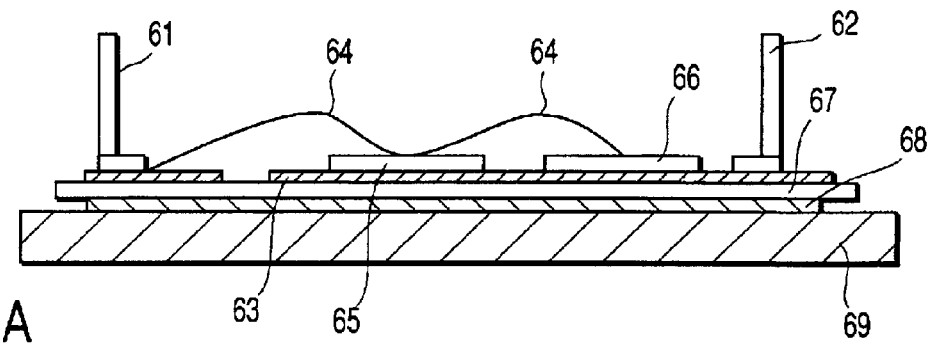
FIG. 9A is a section view showing the structure of a conventional IGBT.
Figure 9B:
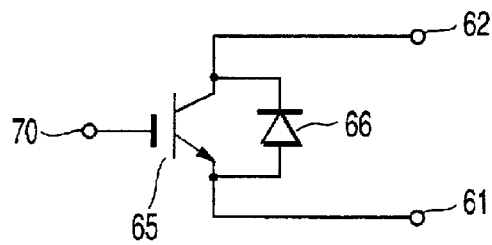
FIG. 9B is a circuit diagram of the conventional IGBT.

In an IGBT module of the prior art as shown in FIG. 9, electrodes and Cu patterns or the like on the IGBT chip and diode chip are connected electrically to the external power terminal through bonding wire. In this case, for a module requiring, for instance, a large current, the number of bonding wires is increased to respond to the required large current. However, since bonding wires each having a certain length are used, the resistance of bonding wires and the self-inductance caused by their length increase.

Figure 1A:
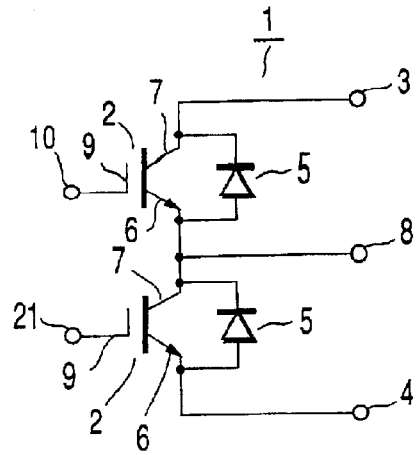
FIG. 1A shows a first embodiment of the present invention, and is a circuit diagram of an IGBT module of half bridge configuration.
Figure 1B:
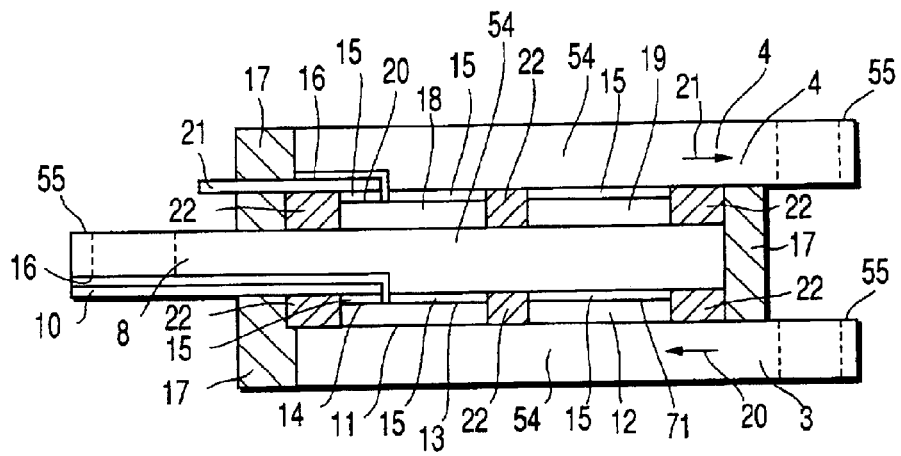
FIG. 1B is a section view of the IGBT module of half bridge configuration in the first embodiment.

Considering this problem, the invention is for connecting directly the IGBT chip and the external power terminal as shown in FIG. 1B for example, in order to solve the problem of increase of bonding wire resistance and inductance. Thereby, it is proposed to provide a specific structure for reducing resistance component produced by the use of bonding wire and self-inductance component.

In this case, as for the external power terminal disposed in the upper part and the lower part, a structure for flowing current inversely is adopted. Such a structure allows to reduce the inductance by the mutual inductance effect. At the same time, the adoption of a structure allowing to use the external power terminal as heat radiation plate realizes the reduction of heat resistance by avoiding to use as separate heat radiation plate and the cost reduction by eliminating a part.

In short, in a IGTB module for example, the invention intends to reduce the resistance and the inductance of power wiring portion, and cut the cost, by connecting external power terminals directly to the top face electrode and the bottom face electrode of an IGTB chip.

Now, the invention will be described in detail based on embodiments shown in accompanying drawings. The following description is one embodiment concerning the invention, and has an object to illustrate the general principle of the invention, and the invention is not limited to the configuration described concretely in this embodiment. The invention can also be applied, for instance, to thyristor module, power transistor and power IC or the like in addition to IGBT module described in detail in the specification. Similar elements in the following detailed description and illustration of drawings are represent by the similar reference numbers.

(First Embodiment)

FIG. 1A shows a IGBT module 1 having a half bridge configuration, which is a first embodiment of the present invention. The a circuit diagram of this IGBT module 1 is shown in FIG. 1A, a schematic section view of this IGBT module is shown in FIG. 1B and a plan view showing the schematic configuration of this IGBT module inside is shown in FIG. 1C.

In the IGBT half bridge circuit shown in FIG. 1A, two IGBT elements 2 are connected in series and a collector 7 of one IGBT element and an emitter of the other IGBT element are connected respectively to a first and a second external power elements 3, 4. In addition, diodes 5 are connected respectively in parallel to the emitter 6 and the collector 7 of respective IGBT elements. A relay power terminal 8 which is third external power element is connected between two IGBT elements. Control terminals 10, 21 are connected respectively to a gate of two IGBT elements 2.

Figure 1C:
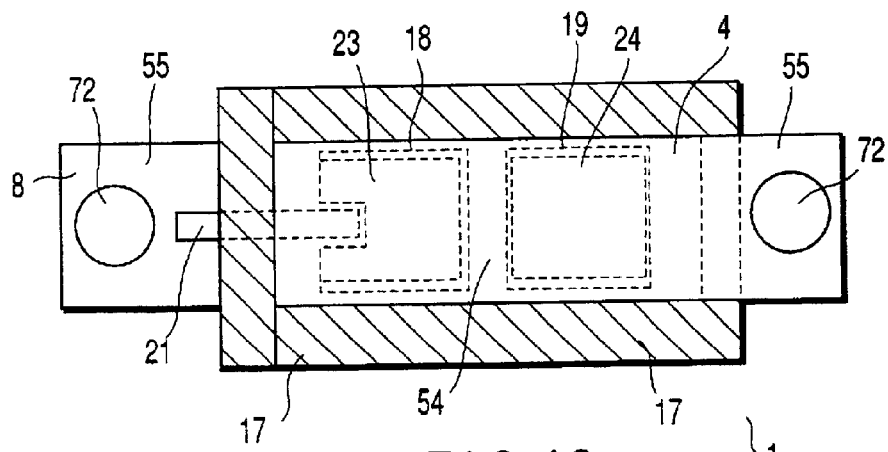
FIG. 1C is an inside plan view of the IGBT module of half bridge configuration in the first embodiment.

The structure of this IGBT module is shown in FIG. 1B and FIG. 1C. In the section view of FIG. 1B, a collector side electrode of a first IGBT chip 11 and a n layer side electrode of the first diode chip 12 are connected to a first external power terminal 3 of the lower part by soldering or the other methods. A metal film is formed on each electrode in order to facilitate a connection. In this case, other than soldering, both electrodes can be adhered using, for instance, a conductive resin. Here, an insulator layer 22 made, for example, of polyimide resin, epoxy resin or the like, may be arranged around the IGBT chip 11 and the diode chip 12 for securing a mutual insulation of the IGBT chip 11 and the diode chip 12. Copper or copper alloys excellent in heat conductivity and electric conductivity are used in general, for the external power terminals 3, 4 and the relay power terminal 8, and DBC substrate is used as necessary. These terminals function also as heat diffusion member for diffusing head generated in respective chips.

A metal film is formed on an emitter surface 13 of the aforementioned IGBT chip 11 and a p layer surface 71 of the diode chip 12 for facilitating the electric connection. Then, the relay power terminal 8 is connected to the semiconductor chip by soldering or other methods, through a buffer plate 15 of molybdenum thin plate or the like, for example, to buffer the stress generated between the semiconductor chip and the electric terminals. Copper or copper alloys are used also for the relay power terminal 8 as for the first external power terminal, and DBC substrate is used as necessary.

A control terminal 10 is also connected to a gate surface 14 of the IGBT chip 11, similarly through a buffer plate 15. It is preferable to form this control terminal in a molded resin holder 17 constituting a housing for the IGBT module 1. As necessary, an insulation layer 16 is provided between the relay power terminal 8 and the control terminal 10. As the other structure, it is also possible to connect the control terminal 10 and the gate surface 14 by wire bonding (refer to control terminal 38 and bonding wire 39 in FIG. 3).

By a method similar to the case of the external power terminal 3, a second IGBT chip 18 and a second diode chip 19 are further connected to the relay power terminal 8 by soldering or other method. And further, a second external power terminal 4 is connected to the surface of respective second chips 18, 19 by soldering or other methods through a buffer plate 15. Copper, copper alloys or DBC plate is used similarly for the external power terminal 4. In this embodiment, the external power terminals 3, 4 and the relay power terminal 8 have an elongated thin plate configuration, have an area 54 connected to the semiconductor chips and a lead out area 55 to the outside, and have a thickness enough for facilitating heat diffusion to the outside.

In such arrangement, at least the external power terminal 3 and the external power terminal 4 are arranged in parallel and opposed to each other, and disposed so that the current flowing in respective external power terminals 3, 4 flows in the opposite direction.

A control terminal 21 is also connected to a gate surface 20 of a second IGBT chip 18 by soldering, bonding or other methods. Though FIG. 1B shows an example of connecting the control terminal 21 by soldering, it may also be connected by wire bonding similarly as the control terminal 10 of the first IGBT chip 11. As necessary, an insulation layer 16 is provided between the second external power terminal 4 and the control terminal 21. The assembling operation can be facilitated by forming also this control terminal 21 in the resin holder 17 beforehand.

It is preferable to arrange an insulator layer 22 made, for example, of polyimide resin, epoxy resin or the like, around the IGBT chips 11, 18 and the diode chips 12, 19 for securing a mutual insulation between chips and between electrodes.

FIG. 1C shows a plan view of the module inside. The second external power terminal 4 is constituted to cover entirely an emitter electrode 23 of the second IGBT chip 18 and a p layer side electrode 24 of the second diode chip 19. A through hole 71 is formed in the second external power terminal 4 and relay power terminal 8 for connecting with the power terminal of a power apparatus using this IGTB module. A external power terminal 3 (not shown) may also have a similar structure.

The adoption of such configuration reduces considerably the voltage drop by the internal wiring, because the connection between electrodes of IGBT chips 11, 18 and external power terminals 3, 4, 8 is realized by a short distance and through a surface. Also, in a case of adopting an array of the external power terminals 3 and 4 for flowing current mutually in the opposite direction in a way to reduce the inductance component due to the wiring, it is possible to intend to reduce the mutual inductance.

Further, in addition to the external power terminals 3 and 4, the relay power terminal 8 can be made to function as heat radiation plate, thereby making it unnecessary to connect additionally a new another heat radiation plate, allowing, therefore, to intend to reduce the number of processes during assembling or use of the module, and to cut the cost.

In addition, the insulation substrate for electric wiring layout is not required, thereby making it unnecessary to use an insulation substrate of lower heat conductivity than the metal, and a low heat resistance can be realized.

(Second Embodiment)

Figure 2A:
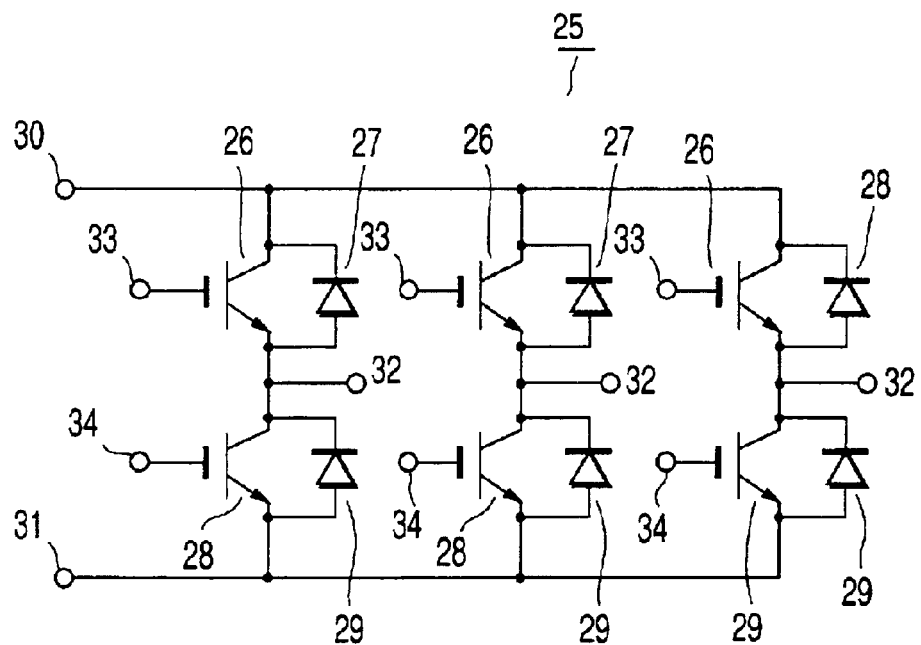
FIG. 2A is a circuit diagram of an IGBT module of 6in1 structure according to a second embodiment.
Figure 2B:
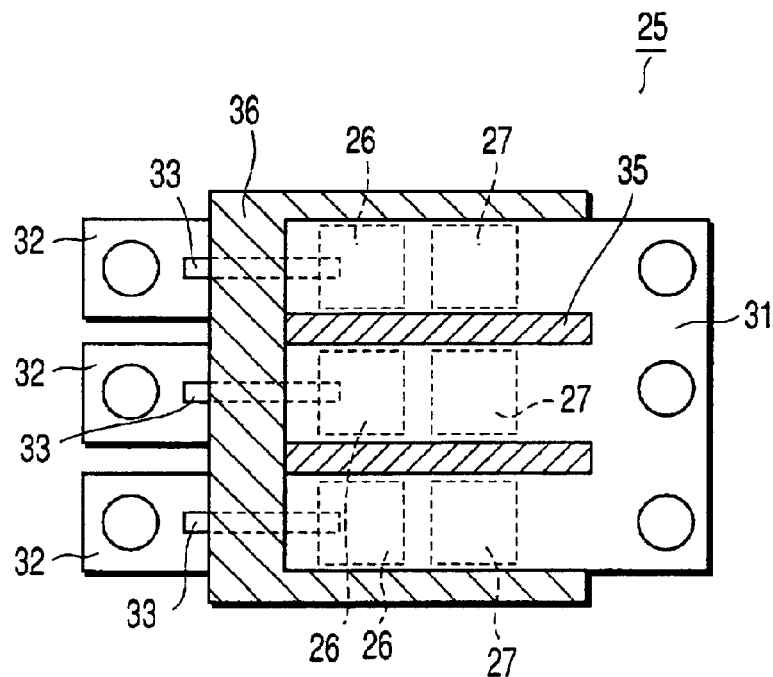
FIG. 2B is an inside plan view of the IGBT module of 6in1 structure of the second embodiment.

FIG. 2 shows an IGBT module 25 of 6in1 structure which is a second embodiment of the invention. Here, FIG. 2A shows the circuit diagram of an IGBT module, and FIG. 2B shows the module inside plan view.

In the second embodiment, a single module is constituted by connecting in parallel three circuits of IGBT module of the first embodiment. Three upper IGTB 26 are arranged on three lower IGBT 28, and upper and lower IGBT 26, 27 are connected respectively in series, forming a three phased structure. In addition, three upper diodes 27 are arranged on three lower diodes 29, and upper and lower diodes are connected in parallel respectively to the corresponding IGBT.

Respective phase is bound respectively to the first external power terminal 30 and the second external power terminal 31 integrating three phases. A relay power terminal 32 is formed at the junction of upper and lower elements of each phase, and control terminals 33, 34 to be connected to the gate of each IGBT 26, 27 are formed. The internal structure is similar to the first embodiment shown in FIG. 1B and FIG. 1C, but an insulation layer 35 can be provided for securing insulation between respective phases. A resin holder 36 forms a housing for the module 25.

Having the aforementioned configuration, the second embodiment can realize the simplification of structure and the miniaturization of apparatus in a case of using as three-phased module, in addition to the effects mentioned for the first embodiment.

(Third Embodiment)

Figure 3:
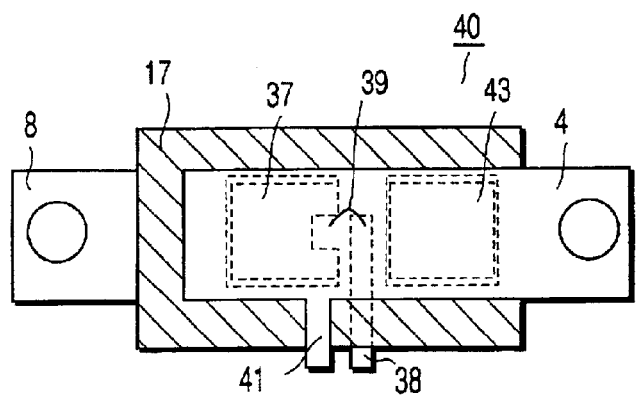
FIG. 3 is an inside plan view in a case of modifying the layout of a control terminal which is a third embodiment.

FIG. 3 shows the inside plan view of a third embodiment modifying the structure of the control terminals 21, 10 and the second external power terminal 4 of the first embodiment. It is different from the first embodiment in that a structure for connecting an IGBT chip 37 and a control terminal 38 by a bonding wire 39 (or soldering) and taking out the control terminal 38 from the center of a module 40.

As necessary, it is also possible to constitute to bring a signal system emitter terminal 41 near the control terminal 38 and to output directly from the external power terminal 4. Such a configuration makes easy to bound the control apparatus with the control system circuit, especially to dispose the wiring, in a case of using the IGBT module for power control apparatus or others.

(Fourth Embodiment)

Figure 4:
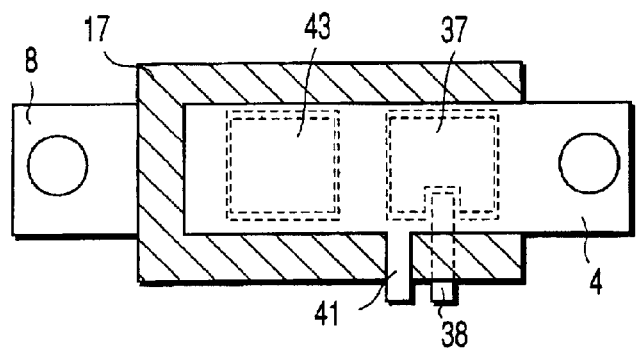
FIG. 4 is an inside plan view in a case of modifying the chip layout which is a fourth embodiment.

FIG. 4 shows the inside plan view of a fourth embodiment modifying the chip layout of the first embodiment. It is different from the first embodiment in that the positions of IGBT chip 37 and diode 43 are modified. As for layout of the control terminal 38, the structures of the first embodiment and the third embodiment can be applied.

Adopting such a configuration, a structure that can realize a still lower resistance and a still lower inductance can be made, because the distance between the IGBT chip 37 and the external connection position of the second external power terminal 4 becomes still shorter. As necessary, it is also possible to arrange the signal system emitter 41 near the control terminal 38.

(Fifth Embodiment)

Figure 5:
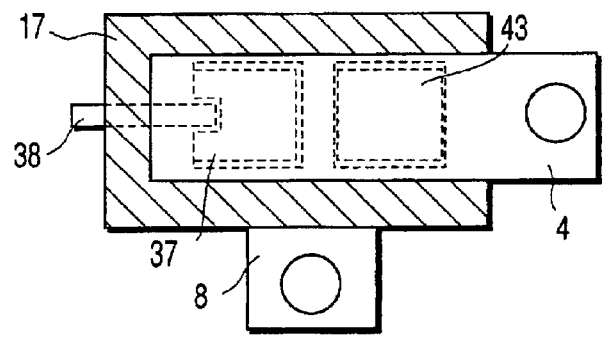
FIG. 5 shows a fifth embodiment and is an inside plan view in a case of modifying the layout of a relay power terminal of the first embodiment.

As shown in FIG. 5, the fifth embodiment modifies the layout of the relay power terminal 8 of the first embodiment. The inside plan view of the fifth embodiment is shown in FIG. 5. It is different from the first embodiment in that the leading out direction of the relay power terminal 8 is perpendicular to the leading out direction of the second external power terminal 4.

Adopting such a configuration, the distance between the relay power terminal 8 and the external power terminal 45 becomes shorter, allowing to intend to reduce the electric resistance between the external power terminal 45 and the relay power terminal 8.

(Sixth Embodiment)

Figure 6:
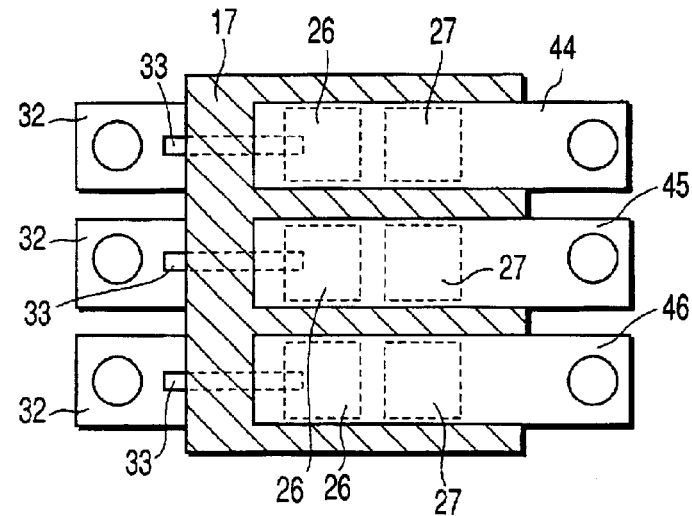
FIG. 6 shows a sixth embodiment and is an inside plan view in a case of dividing the external power terminal of the second embodiment.

FIG. 6 shows the structure of a sixth embodiment. The sixth embodiment is for dividing the second external power terminal 31 of the second embodiment shown in FIG. 2 and a first external power terminal (not shown) respectively into three phases. FIG. 6 shows the inside plan thereof. It is different from the second example in that, as mentioned above, the second external power terminal 31 of FIG. 2 (similar for the first external power terminal) is divided into three eternal power terminals 44 to 46 for each phase.

Adopting such configuration, it becomes possible to intend to miniaturize the module portion and to reduce the number of processes of assembling, in an application of simply using and arranging three IGBT modules 1 of the first embodiment in parallel. Therefore, it can be intended to cut the cost of the module portion.

(Seventh Embodiment)

Figure 7A:
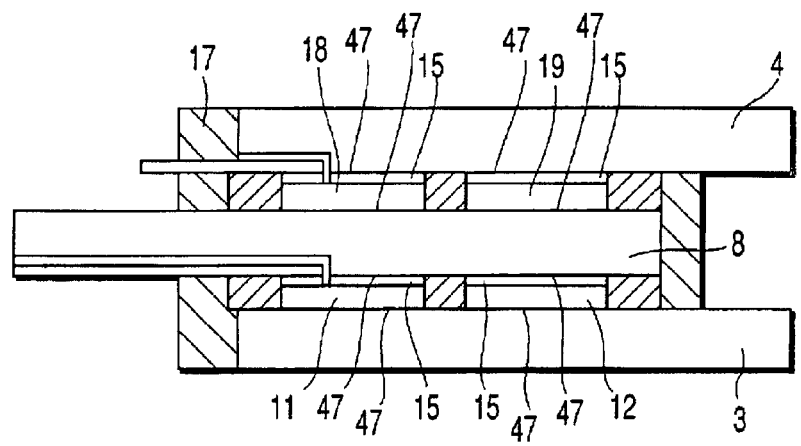
FIG. 7A shows a seventh embodiment and is a drawing in a case of connecting by pressure welding both faces of the chip and respective external power terminals of the first embodiment.
Figure 7B:
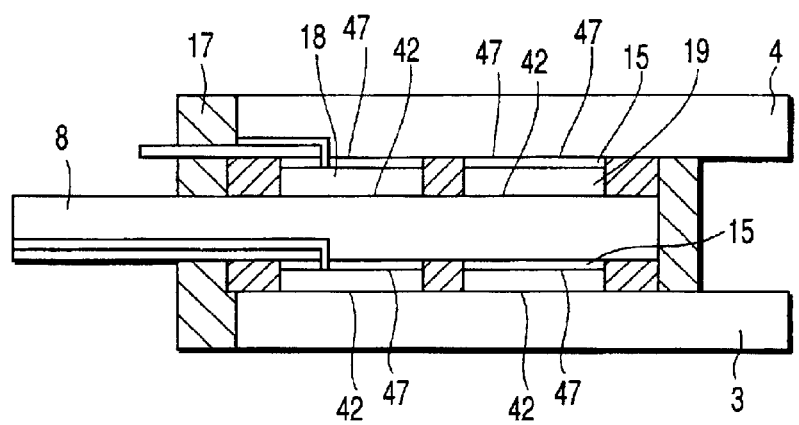
FIG. 7B shows similarly the seventh embodiment and is a drawing in a case of connecting by pressure welding one face of the chip of the first embodiment to the external power terminal, and the other to the power terminal by soldering.
Figure 7C:
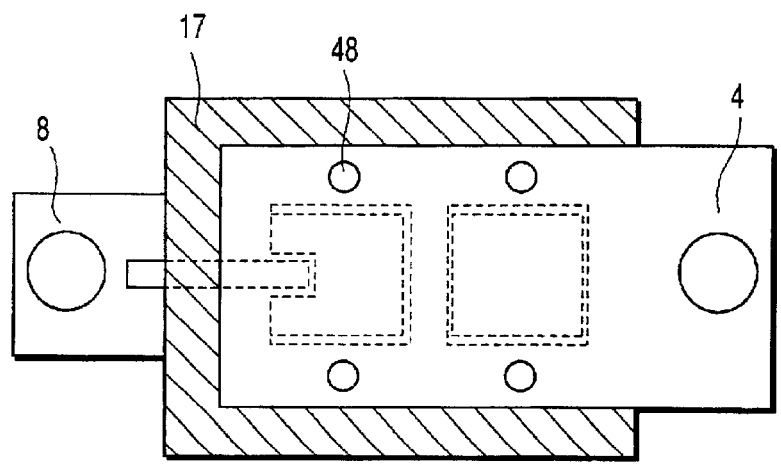
FIG. 7C is a plan view showing the inside in a case of the aforementioned pressure welding connection.

FIG. 7 shows an embodiment in a case of adopting the pressure welding for respective semiconductor chips and respective power terminals of the first example, in place of connection by soldering. FIG. 7A shows a case of connecting by pressure welding 47 both faces of the IGBT chip and diode chips, and FIG. 7B shows a case of connecting by pressure welding 47 only one face of each chip, and the other face by soldering 42. FIG. 7C shows the inside plan view of a case of adopting the pressure welding connection.

The seventh embodiment has a structure of laminating in order an external power terminal 4, a buffer plate 15, semiconductor chips 18, 19 such as IGBT, diode or the like wherein an aluminum electrode is formed by deposition or others, for instance, as pressure welding face, a relay power terminal 8, a buffer plate 15 made, for example, of a molybdenum plate, semiconductor chips 11, 12, and an external power terminal 3. A structure wherein both electrode faces of the semiconductor chip are connected by pressure welding 47 is shown in FIG. 7A. A structure wherein the electrode face of one side of respective semiconductor chips is connected by pressure welding 47 and the other face is connected by soldering is shown in FIG. 7B. When the pressure welding method is adopted, a method for providing a screw fixing hole 48 on the external power terminal for pressure welding, and fixing the upper and lower external power terminals 3, 4 by pressure as shown for instance in FIG. 7C can be adopted. The contact resistance can be reduced by adopting such configuration.

(Eighth Embodiment)

Figure 8A:
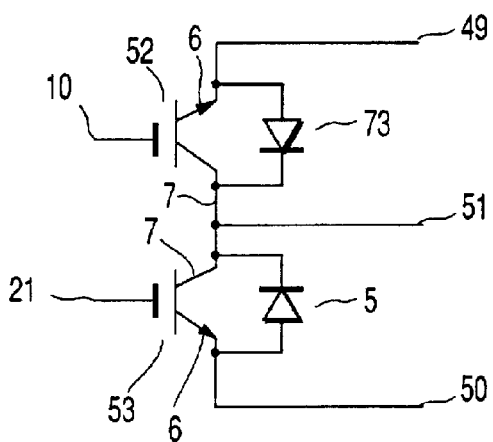
FIG. 8A shows an eighth embodiment and is a circuit diagram in a case of inverting the polarity of one IGBT of IGBTs of the first embodiment.
Figure 8B:
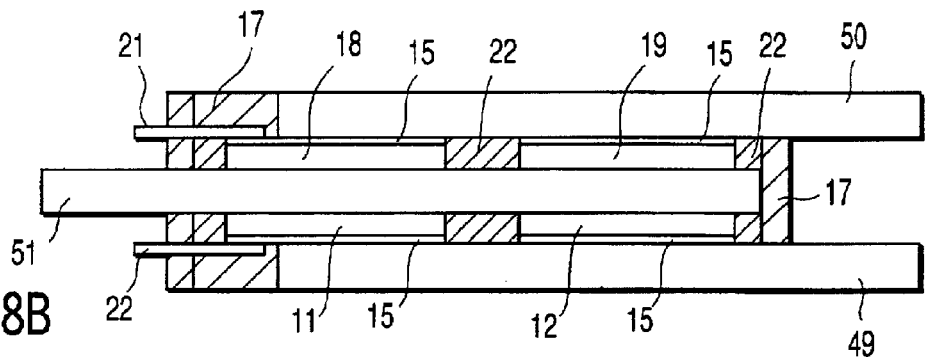
FIG. 8B is a section view of FIG. 8A.

FIG. 8A shows a configuration for inverting the polarity of one IGBT 52 (upside in the drawing) of two IGBTs of the first embodiment. According to this inversion, the diode 73 of the corresponding side is also inverted. Then, the emitter of one IGBT 52 is connected to the fourth power terminal, and the emitter of the other IGBT 53 is connected to the fifth power terminal, both collectors 7 are connected mutually for connecting with a mutual power terminal 51. FIG. 8A shows the circuit diagram, and FIG. 8B shows the sectional structure drawing thereof.

This configuration has an advantage of facilitating the parallel connection of two IGBT elements 52, 53, and increasing the power by such a connection, by connecting the fourth power terminal 49 and the fifth power terminal 50.

Several embodiments of the invention have been illustrated and described above. However, embodiments of the present invention described herein are simply representative embodiments, therefore, various modifications can be made without departing from the technical scope of the present invention. In addition, other than the IGBT module, it can be applied to the large power semiconductor elements such as thyristor, GTO module, power IC or others.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   at least three power terminals provided one above the other; and
   at least one semiconductor chip surrounded by insulated material having a first main surface and a second main surface opposite and parallel to the first main surface, said first and second main surfaces being sandwiched between and in parallel with a predetermined two power terminals of said at least three power terminals, such that the first and second main surfaces of the at least one semiconductor chip are electrically connected to the predetermined two power terminals such that the first and second main surfaces are formed on the predetermined two power terminals.

2. The semiconductor device according to claim 1, wherein the uppermost one and lowermost one of said at least three power terminals extend in the same direction.

3. The semiconductor device according to claim 2, wherein a power terminal positioned at the middle among said at least three power terminals extends in a direction opposite to or perpendicular to the uppermost one or lowermost one of said at least three power terminals.

4. The semiconductor device according to claim 1, wherein one face of said at least one semiconductor chip interposed between said two power terminals is connected to one power terminal of said two power terminals by soldering or pressure welding, and another face is connected another power terminal of said to two power terminals by soldering or pressure welding through a buffer plate.

5. The semiconductor device according to claim 4, wherein the uppermost one and lowermost one of said at least three power terminals have a screw fixing structure so as to connect said at least one semiconductor chip by pressure welding between said two power terminals.

6. The semiconductor device according to claim 1, wherein two currents flow in opposite directions in said uppermost one and lowermost one of said at least three power terminals, while said at least one semiconductor chip is operating.

7. The semiconductor device according to claim 1, wherein said at least one semiconductor chip interposed between said two power terminals includes a plurality of semiconductor chips, and at least one insulation layer is provided between said plurality of semiconductor chips.

8. The semiconductor device according to claim 7, wherein said plurality of semiconductor chips includes at least one transistor and at least one diode, and wherein at least one control electrode is connected to said at least one transistor to control said at least one transistor.

9. The semiconductor device according to claim 8, wherein said at least one transistor has a control electrode pad, said control electrode is connected to said control electrode pad by wire bonding or by interposing a buffer plate between said control electrode and said control electrode pad.

10. The semiconductor device according to claim 8, wherein said control electrode is led out in a direction opposite to or perpendicular to the uppermost one or lowermost one of said at least three power terminals.

11. A semiconductor device comprising:
    at least three power terminals provided one above another; and
    at least one semiconductor chip surrounded by insulating material having a first main surface and a second main surface opposite and parallel to the first main surface, said first and second main surfaces being sandwiched between and in parallel with a predetermined two power terminals of said at least three power terminals, such that the first and second main surfaces of the at least one semiconductor chip are electrically connected to the two power terminals,
    wherein the first main surface of said at least one semiconductor chip interposed between said two power terminals is connected to one power terminal of said two power terminals by soldering or pressure welding, and the second main surface is connected to another power terminal of said two power terminals by soldering or pressure welding such that the first and second main surfaces are formed on the predetermined two power terminals.

12. The semiconductor device according to claim 11, wherein the uppermost one and lowermost one of said at least three power terminals extend in the same direction.

13. The semiconductor device according to claim 12, wherein a power terminal positioned at the middle among said at least three power terminals extends in a direction opposite to or perpendicular to the uppermost one or lowermost one of said at least three power terminals.

14. The semiconductor device according to claim 11, wherein two currents flow in opposite directions in said uppermost one and lowermost one of said at least three power terminals, while said at least one semiconductor chip is operating.

15. The semiconductor device according to claim 11, wherein said at least one semiconductor chip interposed between said two power terminals includes a plurality of semiconductor chips, and at least one insulation layer is provided between said plurality of semiconductor chips.

16. The semiconductor device according to claim 15, wherein said plurality of semiconductor chips includes at least one transistor and at least one diode, and wherein at least one control electrode is connected to said at least one transistor to control said at least one transistor.

17. The semiconductor device according to claim 16, wherein said at least one transistor has a control electrode pad, said control electrode is connected to said control electrode pad by wire bonding or by interposing a buffer plate between said control electrode and said control electrode pad.

18. The semiconductor device according to claim 16, wherein said control electrode is led out in a direction opposite to or perpendicular to the uppermost one or lowermost one of said at least three power terminals.

19. The semiconductor device according to claim 11, wherein the uppermost one and lowermost one of said at least three power terminals have a screw fixing structure so as to connect said at least one semiconductor chip by pressure welding between said two power terminals.

* * * * *